(12) United States Patent
Pinto et al.

(10) Patent No.: US 6,667,226 B2
(45) Date of Patent: Dec. 23, 2003

(54) METHOD AND SYSTEM FOR INTEGRATING SHALLOW TRENCH AND DEEP TRENCH ISOLATION STRUCTURES IN A SEMICONDUCTOR DEVICE

(75) Inventors: Angelo Pinto, Munich (DE); Ricardo A. Romani, Plano, TX (US); Gregory E. Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/024,091

(22) Filed: Dec. 14, 2001

(65) Prior Publication Data

US 2002/0081809 A1 Jun. 27, 2002

Related U.S. Application Data

(60) Provisional application No. 60/258,183, filed on Dec. 22, 2000.

(51) Int. Cl.$^7$ ................ H01L 21/425; H01L 21/8238; H01L 21/336; H01L 21/76
(52) U.S. Cl. ................ 438/524; 438/221; 438/223; 438/224; 438/229; 438/296; 438/424; 438/433
(58) Field of Search ................ 438/424, 524, 438/433, 221, 223, 224, 229, 296

(56) References Cited

U.S. PATENT DOCUMENTS

| | | | | |
|---|---|---|---|---|
| 5,504,033 A | * | 4/1996 | Bajor et al. | 438/405 |
| 5,943,578 A | * | 8/1999 | Katakabe et al. | 438/359 |
| 6,255,184 B1 | * | 7/2001 | Sune | 438/337 |
| 6,287,930 B1 | * | 9/2001 | Park | 438/369 |
| 6,448,124 B1 | * | 9/2002 | Coolbaugh et al. | 438/202 |

* cited by examiner

*Primary Examiner*—John F. Niebling
*Assistant Examiner*—Stanetta Isaac
(74) *Attorney, Agent, or Firm*—Peter K. McLarty; W. James Brady III; Frederick J. Telecky, Jr.

(57) ABSTRACT

A semiconductor device and a method for constructing a semiconductor device is disclosed. A deep trench isolation structure (108) is formed proximate a surface of a semiconductor substrate (106). A deep trench plug (122) layer is deposited within the deep trench isolation structure (108). A shallow trench isolation structure (130) is formed where the deep trench isolation structure (108) meets the surface of the semiconductor substrate (106). A shallow trench plug layer (133) is deposited within the shallow trench isolation structure (130).

25 Claims, 7 Drawing Sheets

METHOD AND SYSTEM FOR INTEGRATING SHALLOW TRENCH AND DEEP TRENCH ISOLATION STRUCTURES IN A SEMICONDUCTOR DEVICE

This application claims priority under 35 USC §119(e)(1) of provisional application Serial No. 60/258,183, filed Dec. 22, 2000.

BACKGROUND OF THE INVENTION

Trench isolation structures are used in semiconductor devices, to improve the operation of transistors and other elements of the semiconductor devices. As the need for smaller device size increases, the area dedicated to isolation spaces must be decreased. Conventional trench isolation techniques, however, require the use of relatively large isolation spaces. Consequently, the incorporation of trench isolation structures in semiconductor devices has posed challenges for semiconductor device fabrication.

SUMMARY OF THE INVENTION

While known approaches have provided improvements over prior approaches, the challenges in the field of semiconductor devices have continued to increase with demands for more and better techniques having greater effectiveness. Therefore, a need has arisen for a new method and system for integrating shallow trench and deep trench isolation structures in a semiconductor device.

In accordance with the present invention, a method and system for integrating shallow trench and deep trench isolation structures in a semiconductor device are provided that substantially eliminate or reduce the disadvantages and problems associated with previously developed systems and methods.

According to one embodiment of the present invention, a method for constructing a semiconductor device is disclosed. A deep trench isolation structure is formed proximate a surface of a semiconductor substrate. A deep trench plug layer is deposited within the deep trench isolation structure. A shallow trench isolation structure is formed where the deep trench isolation structure meets the surface of the semiconductor substrate. A shallow trench plug layer is deposited within the shallow trench isolation structure.

According to another embodiment of the present invention, a method for constructing a semiconductor device is disclosed. A shallow trench isolation structure is formed proximate a surface of a semiconductor substrate. The shallow trench isolation structure is etched to form a deep trench isolation structure where the shallow trench isolation structure meets the surface of the semiconductor substrate. A deep trench plug layer is deposited within the deep trench isolation structure. A shallow trench plug layer is deposited within the shallow trench isolation structure.

According to another embodiment of the present invention, a semiconductor device is disclosed that comprises a semiconductor substrate. A surface of the semiconductor substrate defines a deep trench isolation structure and a shallow trench isolation structure. The deep trench isolation structure meets the surface of the semiconductor substrate where the shallow trench isolation structure meets the surface. A deep trench plug is deposited within the deep trench isolation structure. A shallow trench plug is deposited within the shallow trench isolation structure.

Embodiments of the invention may provide numerous technical advantages. A technical advantage of one embodiment is that shallow trench isolation structures are formed outwardly from deep trench isolation structures. This configuration provides sufficient isolation of transistors, bipolar transistors, and other elements of a semiconductor device while using minimal surface area.

A technical advantage of another embodiment is that an over-etching process may be performed during formation of the shallow trench isolation structures in order to reduce formation of oxide or nitride spikes. A technical advantage of another embodiment is that the deep trench isolation structures are faceted. Faceted deep trench isolation structures have smoother sidewalls, which reduces peaks during formation of shallow trench isolation structures. Additionally, the faceting also allows for easier deposition of material into deep trench isolation structures during formation of deep trench plugs.

Other technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1A through 4F of the drawings, like numerals being used for like and corresponding parts of the various drawings.

FIGS. 1A–1E are a series of cross-sectional views illustrating stages of constructing a semiconductor device 100 in accordance with one embodiment of the present invention. In general, in the illustrated embodiment, shallow trench isolation structures are formed where deep trench isolation structures meet the outer surface of a substrate, in order to isolate active regions of semiconductor device 100 while using minimal surface area. According to the illustrated embodiment, a deep trench plug layer is deposited within deep trench isolation structures prior to the formation of shallow trench isolation structures.

Figure 1A:
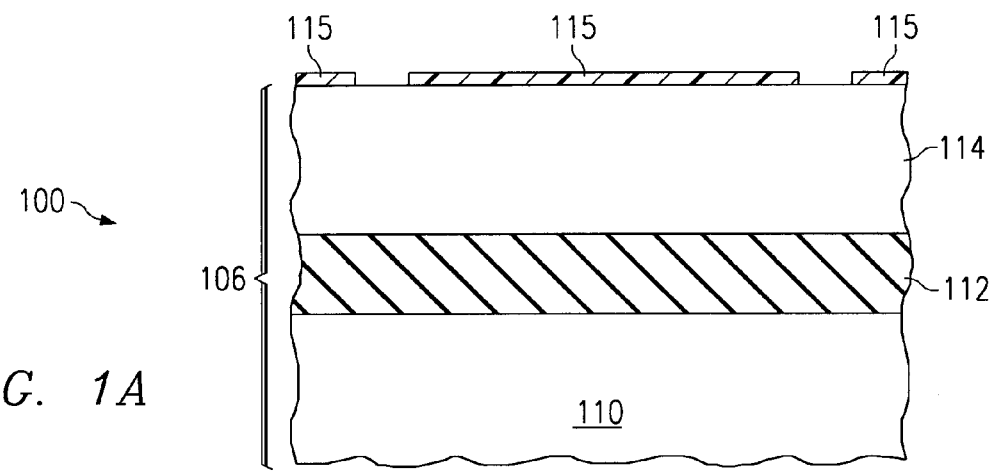
FIGS. 1A–1E are a series of cross-sectional views illustrating stages of constructing a semiconductor device in accordance with one embodiment of the present invention, where a deep trench plug layer is deposited within deep trench isolation structures prior to the formation of shallow trench isolation structures.

FIG. 1A illustrates a deep trench mask layer 115 formed outwardly from a substrate 106. Substrate 106 may comprise an inner substrate 110, a buried insulator layer 112, and an outer substrate 114. Substrate 106 may have any suitable thickness such as approximately 200 to 600 microns. Inner substrate 110 may comprise a semiconductive material such as highly resistive silicon of a suitable thickness such as approximately 200 to 600 microns. Buried insulator layer 112 may comprise an insulative material such as silicon dioxide or silicon nitride grown outwardly from inner substrate 110 to a suitable thickness such as approximately 0.4 to one micron using a suitable oxidation or nitridation process. Buried insulator layer 112 may also comprise a low-resistivity semiconductor material realized by deposition, ion implantation, or dopant activation.

Outer substrate 114 may comprise a semiconductive material such as silicon bonded to buried insulator layer 112 to a suitable thickness such as approximately 0.2 to ten microns using a suitable deposition process such as an epitaxial deposition process. Outer substrate 114 may comprise implant regions formed by suitable implantation of ions, for example, boron or phosphorus ions at an energy of 10 KeV to 2 MeV and a dose of 1 E 11 to 1 E 14 ion-cm$^{-2}$. A heating process such as a furnace anneal process or a rapid thermal anneal process may be performed on substrate 106 to diffuse and activate any such implant regions. Alternatively, substrate 106 may be substantially similar to a substrate 306 described in connection with FIG. 3A.

Deep trench mask layer 115 may comprise a suitable insulative material such as silicon dioxide or silicon nitride deposited outwardly from outer substrate 114 to a suitable thickness such as approximately 0.2 to two microns using a suitable deposition process. Deep trench mask layer 115 may be patterned using suitable patterning processes such as a photolithographic definition process followed by a dry etching process. Photoresist and polymer material formed during these processes may be removed using a suitable stripping process.

Figure 1B:
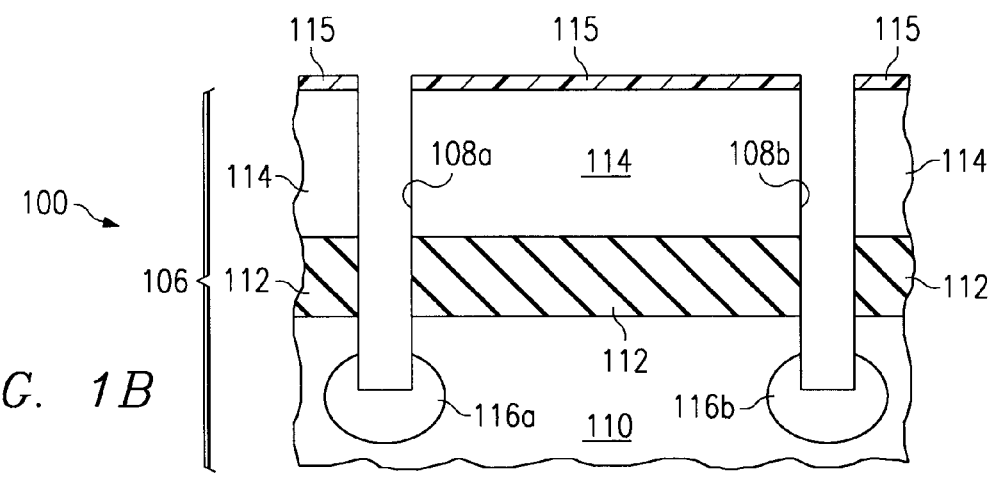

FIG. 1B illustrates the deep trench isolation structures 108 and channel stop implant regions 116 defined from substrate 106. Deep trench isolation structures 108 may be formed by a suitable etching process such as dry etching substrate 106 for approximately at least two microns, for example, twenty microns. Deep trench isolation structures 108 and shallow trench isolation structures 130, however, may have any suitable depths, where the depth of deep trench isolation structures 108 differs from the depth of shallow trench isolation structures 130. For example, the depth of deep trench isolation structures 108 may be approximately 0.4 microns, and the depth of shallow trench isolation structure may be approximately 0.2 microns.

Deep trench mask layer 115 may be removed by a suitable stripping process such as wet etching. Channel stop implant regions 116 may be formed by suitable implantation of ions such as implantation of boron or phosphorus ions at an energy of 10 to 100 KeV and a dose of 1 E 12 to 1 E 14 ions–cm$^{-2}$.

Figure 1C:
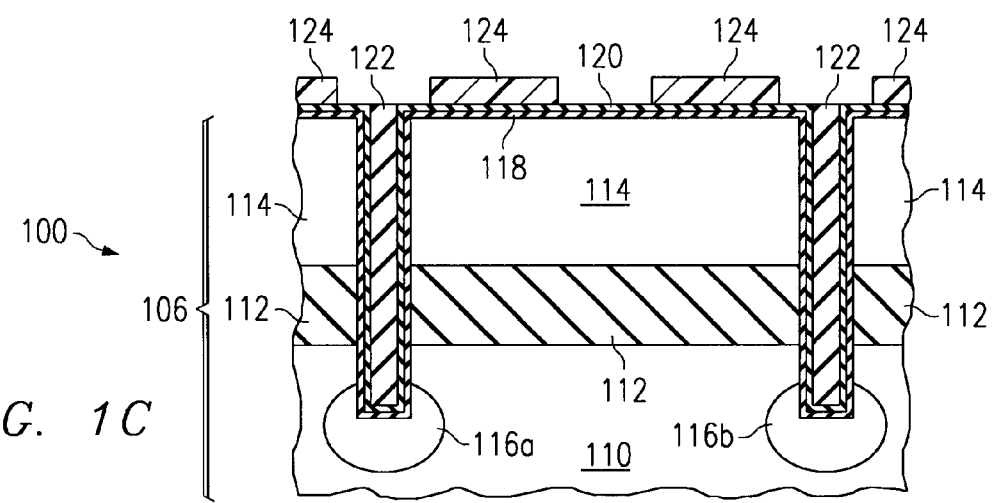

FIG. 1C illustrates a first liner layer 118, a second liner layer 120, a deep trench plug 122, and a shallow trench mask layer 124. First liner layer 118 may comprise an insulative material such as silicon dioxide grown or deposited outwardly from deep trench isolation structures 108 and outer substrate 114 to a suitable thickness such approximately 100 to 200 Å using a suitable deposition process such as thermal oxidation or chemical vapor deposition. Second liner layer 120 may comprise a suitable insulative material such as silicon nitride deposited to a suitable thickness outwardly from first liner layer 118 such as approximately 100 to 2,000 Å using a suitable deposition process such as chemical vapor deposition.

Deep trench plug 120 may comprise a suitable semiconductive material such as intrinsic polycrystalline silicon or a suitable insulative material such as silicon dioxide conformably deposited within deep trench isolation structures 108 using a suitable deposition process such as chemical vapor deposition. A plug for a trench isolation structure having a depth greater than approximately four to five times the width of the outward opening, where the width may be approximately 0.25 to two microns, may comprise a semiconductive material. A plug for a trench isolation structure having a depth less than approximately four to five times the width of the outward opening, where the width may be approximately 0.25 to two microns, may comprise an insulative material. A dry etch-back may be performed after the deposition.

Shallow trench mask layer 124 may comprise a suitable insulative material such as silicon dioxide deposited outwardly from second liner layer 120 to a suitable thickness such as approximately 0.2 to one micron. Shallow trench mask layer 124 may be patterned by suitable patterning processes such as photolithographic definition and etching.

Figure 1D:
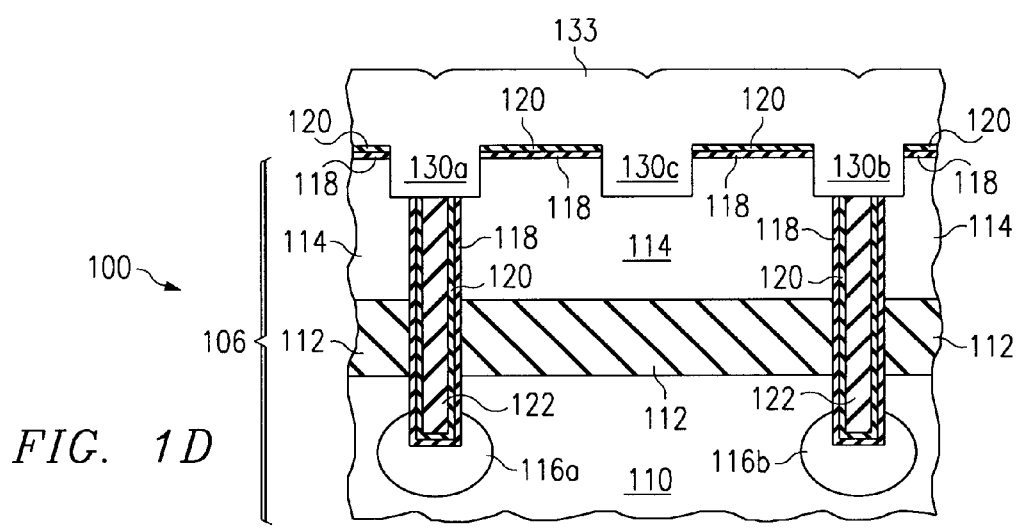

FIG. 1D illustrates shallow trench isolation structures 130 formed proximate the outer surface of outer substrate 114 where deep trench isolation structures 108 meet the outer surface of substrate 106, and a shallow trench plug layer 133 formed outwardly from second liner layer 120. Shallow trench isolation structures 130 may be formed by suitable etching processes such as dry etching second liner layer 120, first liner layer 118, and outer substrate 114 to a depth of less than two microns, for example, 0.2 to 0.5 microns. Shallow trench isolation structures 130 may have a suitable depth such as approximately 3,000 to 10,000 Å.

An over-etching process may be performed to recess first liner layer 118 and second liner layer 120 in order to reduce formation of spikes such as oxide or nitride spikes. Shallow trench mask layer 124 and resist and polymer material resulting from the etching process may be removed. Shallow trench plug layer 133 may comprise a suitable insulative material such as silicon oxide conformably deposited within shallow trench isolation structures 130 and outwardly from second liner layer 120 to a suitable thickness such as approximately 3,000 to 10,000 Å using a suitable deposition process such as chemical vapor deposition.

Figure 1E:
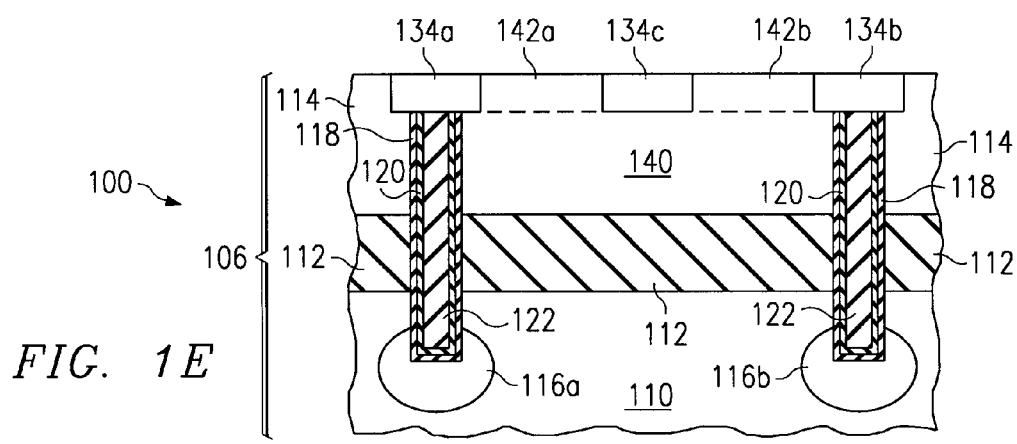

FIG. 1E illustrates shallow trench plugs 134, active regions 142, and deep trench isolated region 140. Shallow trench isolation structures comprise shallow trench plugs 134, which may be formed by planarizing shallow trench plug layer 133, second liner layer 120, and first liner layer 118 using a suitable planarization process such as chemical-mechanical polishing followed by a silicon nitride strip process.

Shower trench isolation structures 130a and 130c isolate active region 142a, and shallow trench isolation structures 130b and 130c isolate active region 142b allowing elements such as transistors located at these active regions 142 to function properly. Deep trench isolation structures 108a and 108b isolate deep trench isolated region 140, which allows elements such as bipolar transistors located at active regions 142 of deep trench isolated region 140 to function properly.

FIGS. 2A–2E are a series of cross-sectional views illustrating stages of constructing a semiconductor device 200 in accordance with one embodiment of the present invention, where shallow trench isolation structures are formed prior to deposition of a deep trench plug layer within deep trench isolation structures.

Figure 2A:
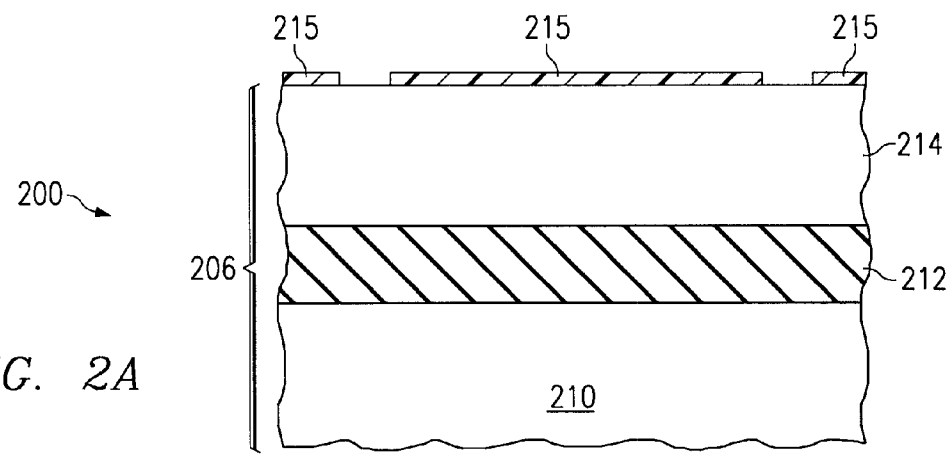
FIGS. 2A–2E are a series of cross-sectional views illustrating stages of constructing a semiconductor device in accordance with one embodiment of the present invention, where shallow trench isolation structures are formed prior to deposition of a deep trench plug layer within deep trench isolation structures.

FIG. 2A illustrates a substrate 206 and a deep trench mask layer 215 formed outwardly from substrate 206. Substrate 206 comprises an inner substrate 210, a buried insulator layer 212, and an outer substrate 214, which may be substantially similar to inner substrate 110, buried insulator layer 112, and outer substrate 114, respectively, described in connection with FIG. 1A. Alternatively, substrate 206 may be substantially similar to substrate 306 as described in connection FIG. 3A. Deep trench mask layer 215 may be substantially similar to deep trench mask layer 115 described in connection with FIG. 1A.

Figure 2B:
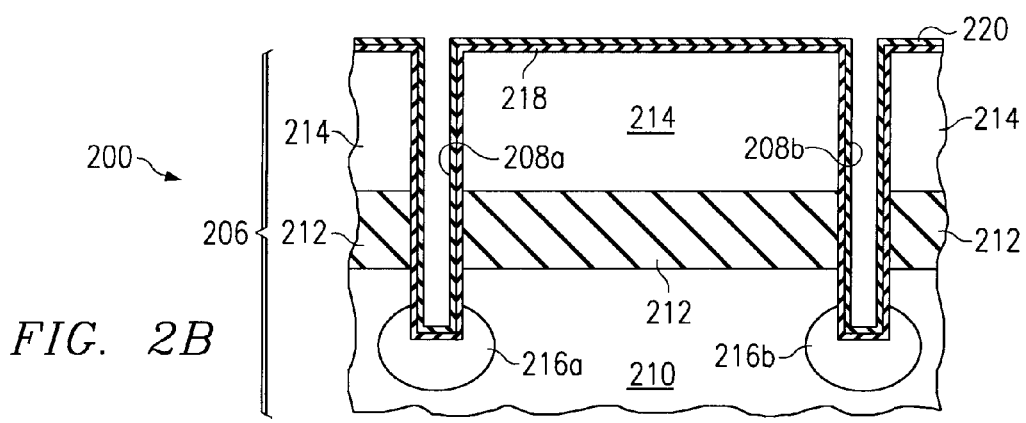

FIG. 2B illustrates deep trench isolation structures 208 and channel stop implant regions 216. Deep trench isolation structures 208 and channel stop implant regions 216 may be substantially similar to deep trench isolation structures 108 and channel stop implant regions 116, respectively, described in connection with FIG. 1B. A first liner layer 218 and a second liner layer 220 may be substantially similar to first liner layer 118 and a second liner layer 120, respectively, described in connection with FIG. 1C.

Figure 2C:
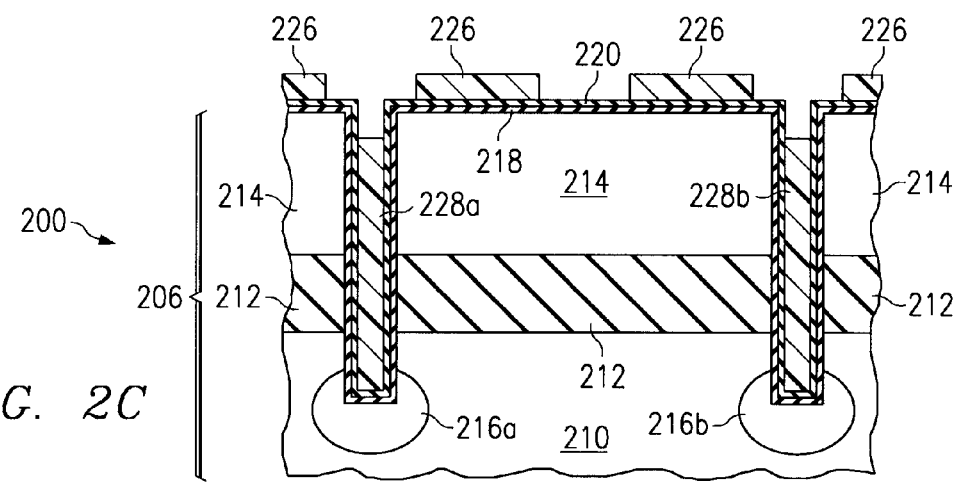

FIG. 2C illustrates a resist layer 226 and a resist plug 228. Resist layer 226 may comprise an insulative material such as silicon dioxide conformably deposited outwardly from second liner layer 220 to a suitable thickness such as approximately two microns using a suitable deposition process. Resist layer 226 may be defined using suitable patterning processes such as photolithographic definition and etching to produce a shallow trench isolation structure 230 having a suitable width such as approximately 0.5 to one micron. Resist plug 228 may comprise an insulative material such as silicon dioxide conformably deposited within deep trench isolation structures 108 using a suitable deposition process, and may be formed from resist layer 226.

Figure 2D:
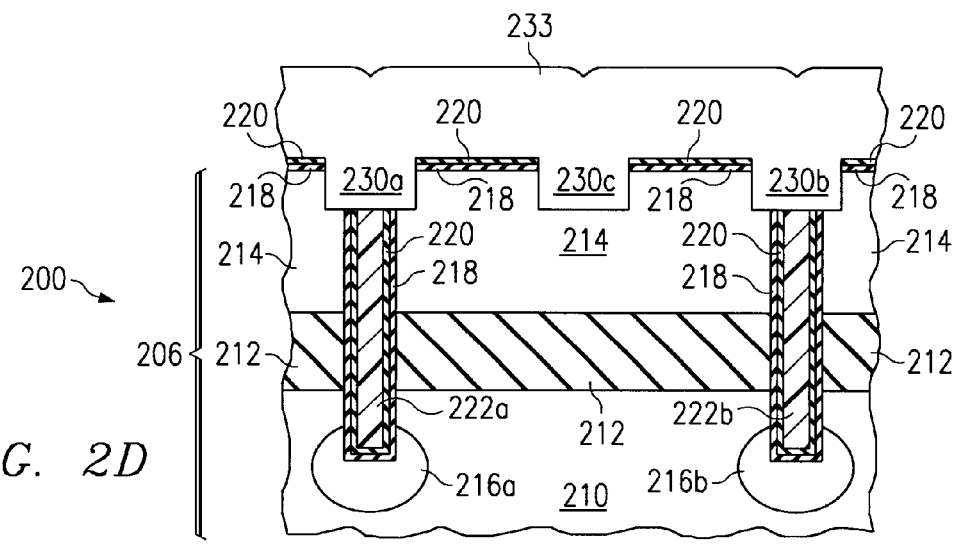

FIG. 2D illustrates shallow trench isolation structures 230. Shallow trench isolation structures 230a and shallow trench plug layer 233 may be substantially similar shallow trench isolation structures 130 and shallow trench plug layers 133, respectively, described in connection with FIG. 1D. Resist plug 228 may protect channel stop implant regions 216 and the sidewalls of deep trench isolation structures 208 during the formation of shallow trench isolation structures 230. Resist layer 226, resist plugs 228, and polymer material produced during formation of shallow trench isolation structures 230 may be removed using a suitable stripping process.

After formation of shallow trench isolation structures 230, additional suitable layering processes may be performed, for example, thermal oxidation or chemical vapor deposition of silicon dioxide. The surface may be planarized to remove first liner layer 218 and second layer 220 using a suitable planarization process such as chemical mechanical polishing.

Deep trench plugs 222 may be substantially similar to deep trench plugs 122 as described in connection with FIG. 1C. A shallow trench plug layer 233 may comprise an insulative material such as silicon dioxide conformably deposited within shallow trench isolation structures 230 to a suitable thickness such as approximately 0.3 to one micron using a suitable deposition process such as chemical vapor deposition.

Figure 2E:
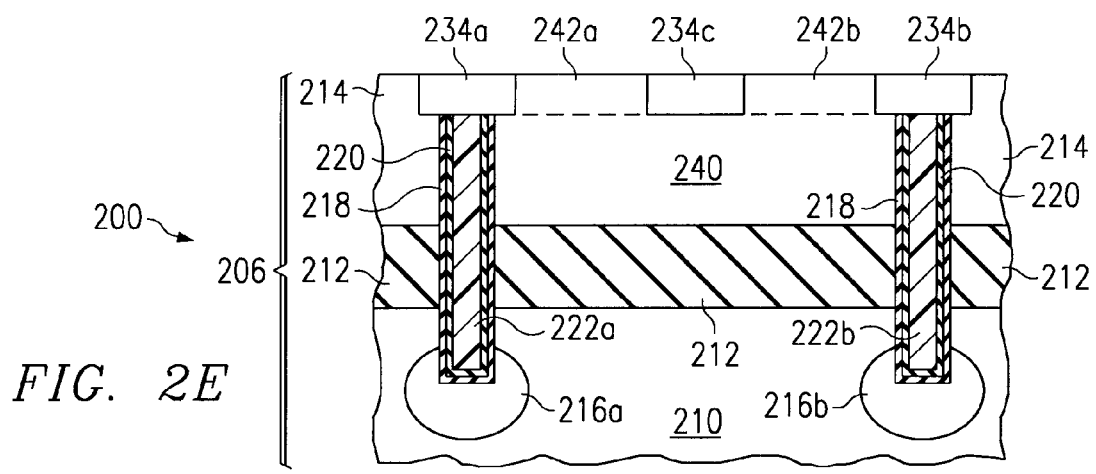

FIG. 2E illustrates active regions 242 and a deep trench isolated region 240. Shallow trench plugs 234 may be substantially similar to shallow trench plugs 134 as described in connection with FIG. 1E. Active regions 224 and deep trench isolated region 240 may be substantially similar to active regions 124 and deep trench isolated region 140 as described in connection with FIG. 1E.

FIGS. 3A–3E are a series of cross-sectional views illustrating stages of constructing a semiconductor device 300 in accordance with one embodiment of the present invention, where faceted deep trench isolation structures are formed.

Figure 3A:
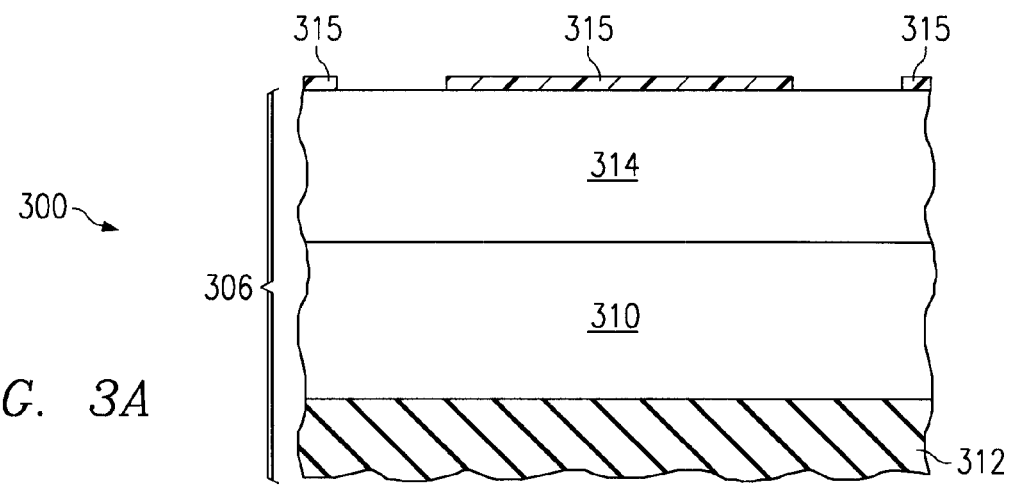
FIGS. 3A–3E are a series of cross-sectional views illustrating stages of constructing a semiconductor device in accordance with one embodiment of the present invention, where the deep trench isolation structures are faceted.

FIG. 3A illustrates a substrate 306 and a deep trench mask layer 315. Substrate 306 comprises a buried insulator layer 312, an inner substrate 310 formed outwardly from buried insulator layer 312, and outer substrate 314 formed outwardly from inner substrate 310. Substrate 306 may have any suitable thickness, for example, 200 to 300 microns. Buried insulator layer 312 may comprise a suitable insulative material such as silicon dioxide or silicon nitrate of a suitable thickness such as approximately 0.2 to one micron.

Inner substrate 310 may comprise a suitable semiconductive material such as silicon deposited to a suitable thickness such as approximately 0.2 to one micron using a suitable deposition process. Outer substrate 314 may comprise a semiconductive material such as silicon deposited to a suitable thickness such as approximately 0.2 to one micron microns using a suitable deposition process. Alternatively, substrate 306 may be substantially similar to substrate 106 as described in connection with FIG. 1A. Deep trench mask layer 315 may be substantially similar to deep trench mask layer 115 as described in connection with FIG. 1A.

Figure 3B:
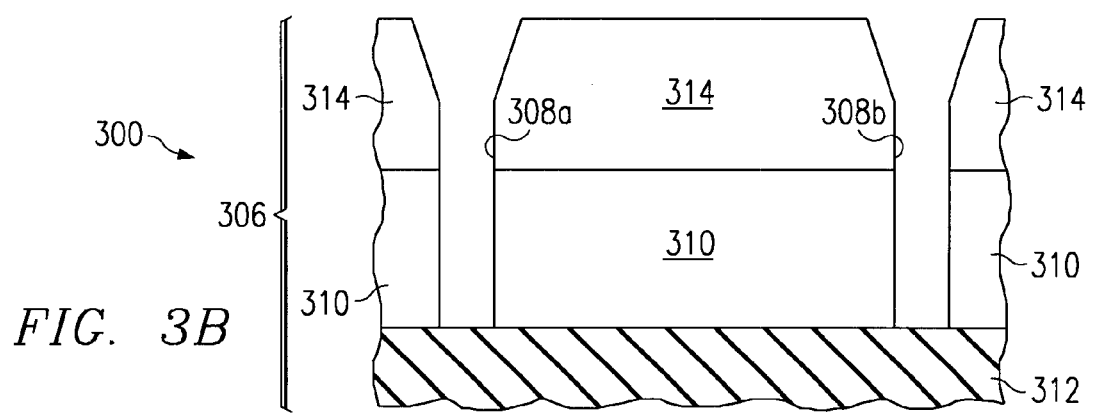

FIG. 3B illustrates deep trench isolation structures 308. Deep trench isolation structures 308 may be formed proximate the outer surface of substrate 306 using a suitable patterning process that produces faceting at the top of trench isolation structures 308. An outward opening of a deep trench isolation structure 308 may be sufficiently large to accommodate a shallow trench isolation structure 330. For example, an outward opening of deep trench isolation structure 308 may be approximately the same size as an outward opening of shallow trench isolation structure 330.

Faceted deep trench isolation structures 308 have smoother sidewalls, which reduces the formation of peaks during formation of shallow trench isolation structures 330. Additionally, the faceting may also allow for easier deposition of material into deep trench isolation structures 308 during formation of deep trench plugs 322.

Figure 3C:
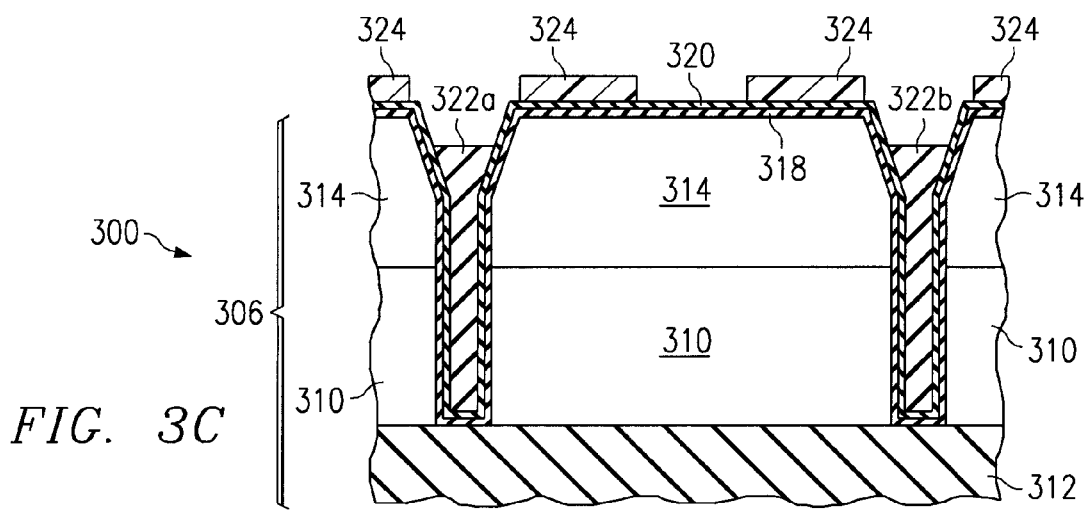

FIG. 3C illustrates a first liner layer 318, a second liner layer formed outwardly from first liner layer 318, deep trench plugs 322 deposited within deep trench isolation structures 308, and a shallow trench mask layer 324 formed outwardly from second liner layer 320. First liner layer 318, second liner layer 320, deep trench plug 322, and shallow trench mask layer 324 may be substantially similar to first liner layer 118, second liner layer 120, deep trench plug 122, and shallow trench mask layer 124, respectively, as described in connection with FIG. 1C.

Figure 3D:
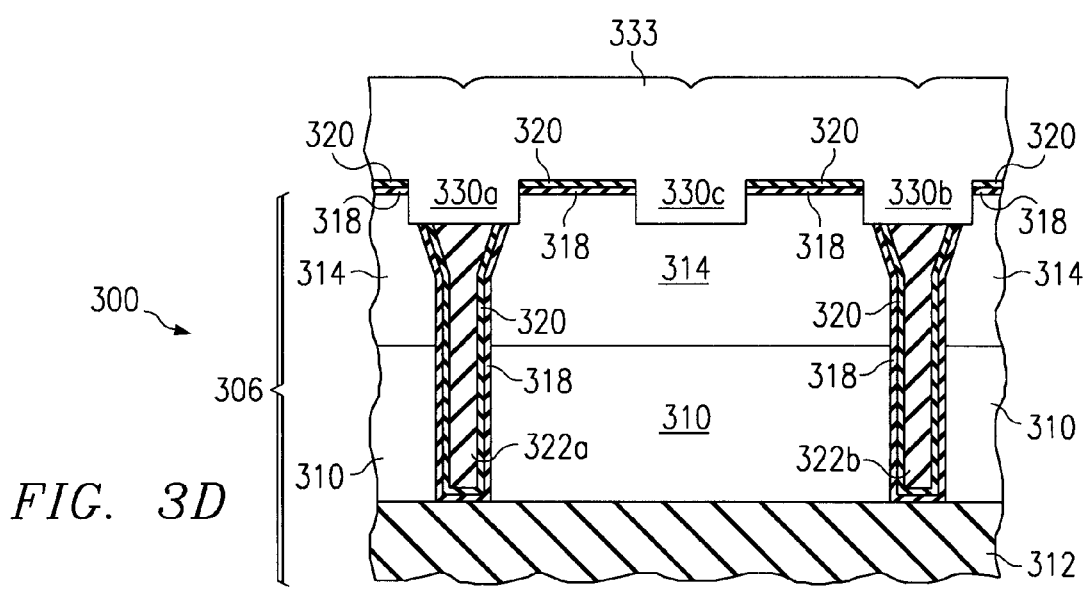

FIG. 3D illustrates shallow trench isolation structures 330. Shallow trench isolation structures 330 may be substantially similar to shallow trench isolation structures 130 as described in connection with FIG. 3D. The faceting of deep trench isolation structures 308 reduces the formation of peaks associated with first liner layer 318 and second layer 320. Additionally, the faceting of deep trench isolation structures 308 may also reduce any need for over-etching first insulator layer 320 and second insulator layer 318 formed outwardly from deep trench isolation structures 308. A shallow trench plug layer 333 may be substantially similar to shallow trench plug layer 133 as described in connection with FIG. 1D.

Figure 3E:
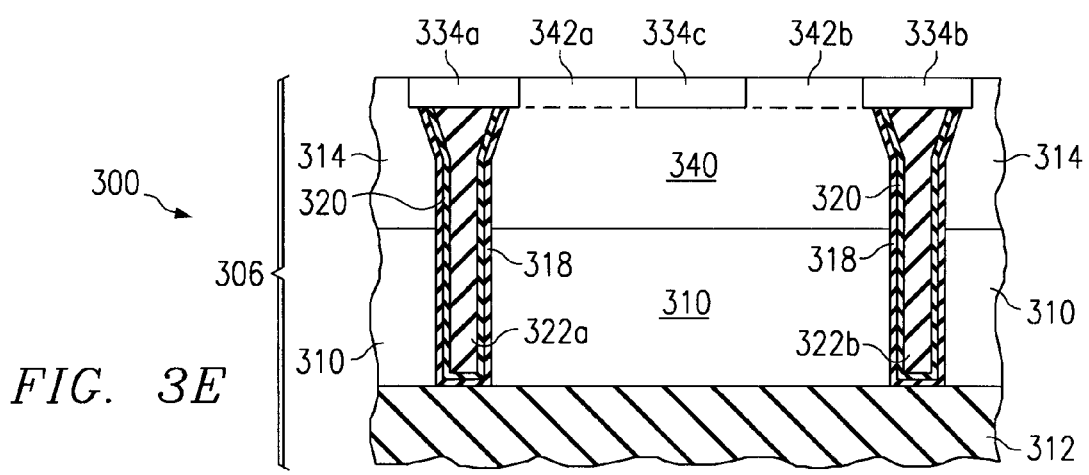

FIG. 3E illustrates active regions 342 and deep isolation regions 340. Shallow trench plugs 344 substantially similar to shallow trench plugs 144, as described in connection with FIG. 1E. Active regions 324 and deep trench isolated region 340 may be substantially similar to active regions 124 and deep trench isolated region 140, respectively, as described in connection with FIG. 1E.

FIGS. 4A–4F are a series of cross-sectional views illustrating stages of constructing a semiconductor device 400 in accordance with one embodiment of the present invention, where shallow trench isolation structures are formed prior to the formation of deep trench isolation structures.

Figure 4A:
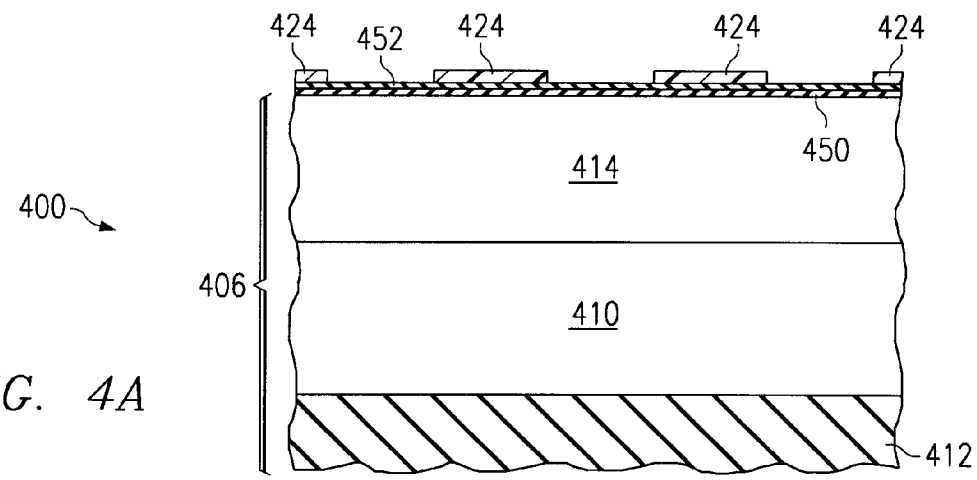
FIGS. 4A–4F are a series of cross-sectional views illustrating stages of constructing a semiconductor device in accordance with one embodiment of the present invention, where shallow trench isolation structures are formed prior to the formation of deep trench isolation structures.

FIG. 4A illustrates a substrate 406, a first insulator layer 450 formed outwardly from substrate 406, a second insulator layer 452 formed outwardly from first insulator layer 452, and a shallow trench mask layer 424 formed outwardly from second insulator layer 450. Substrate 406 comprises a buried insulator layer 412, an inner substrate 410, and an outer substrate, which may be substantially similar to buried insulator layer 312, inner substrate 310 and outer substrate 414, respectively, as described in connection with FIG. 3A. Alternatively, substrate 406 may be substantially similar to substrate 106 as described in connection with FIG. 1A.

First insulator layer 450 may comprise an insulative material such as silicon dioxide grown to a suitable thickness such as approximately 100 to 200 Å using a suitable growing process such as thermal oxidation. Second insulator layer 450 may comprise an insulative material such silicon nitride deposited to a suitable thickness such as 100 to 2,000 Å using a suitable deposition process such as chemical vapor deposition. Shallow trench mask layer 424 may be substantially similar to shallow trench mask layer 124 as described in connection with FIG. 1A.

Figure 4B:
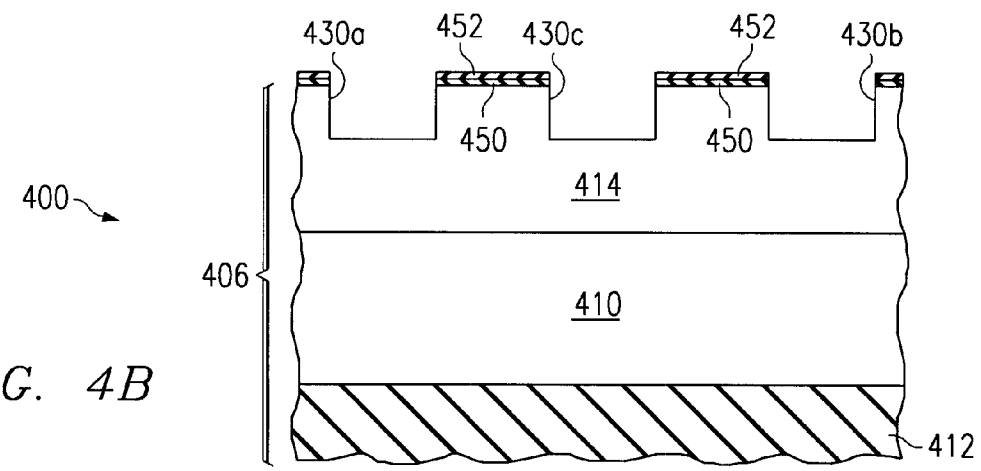

FIG. 4B illustrates shallow trench isolation structures 430. Shallow trench isolation structures may be formed by a suitable etching process such as dry etching second insulator layer 452, first insulator layer 450, and outer substrate 414.

Figure 4C:
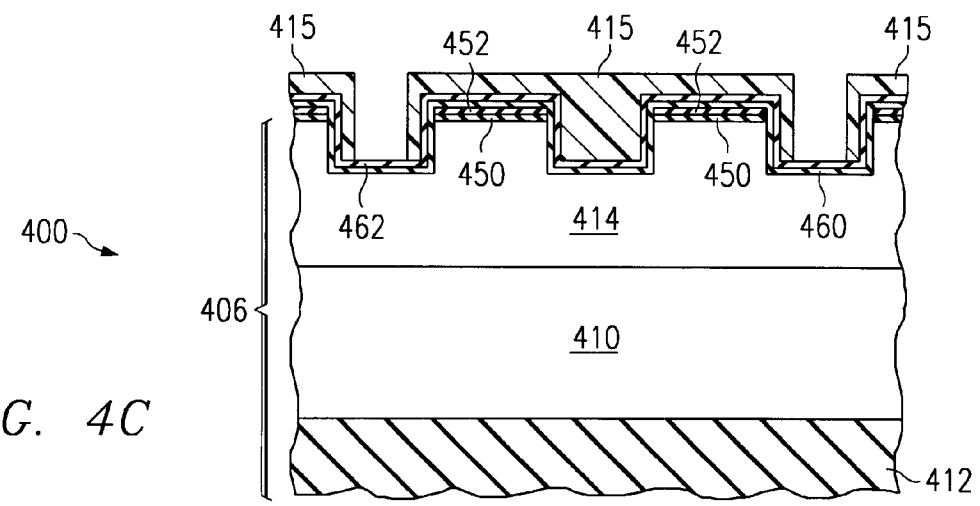

FIG. 4C illustrates first shallow trench liner 460, a second shallow trench liner layer 462, and a deep trench mask layer 415. First shallow trench liner layer 460 may comprise an insulative material such as silicon dioxide grown outwardly from substrate 406 and second insulator layer 452 to a suitable thickness such as approximately 100 to 200 Å using any suitable growing process. Second shallow trench liner layer 462 may comprise an insulative material such as silicon nitride grown outwardly from first shallow trench liner layer 460 to a suitable thickness such as 300 to 2,000 Å using any suitable growing process.

First shallow trench liner layer 460 and second shallow trench liner layer 462 may be omitted if substrate 406 is substantially similar to substrate 106 as described in connection with FIG. 1A. Deep trench mask layer 415 formed outwardly from second shallow trench liner layer 462 may be substantially similar to deep trench mask layer 115 as described in connection with FIG. 1A. The thickness of deep trench mask layer 415 may be selected such that its thickness after an etching process to define deep trench isolation is approximately 500 to 2,000 Å.

Figure 4D:
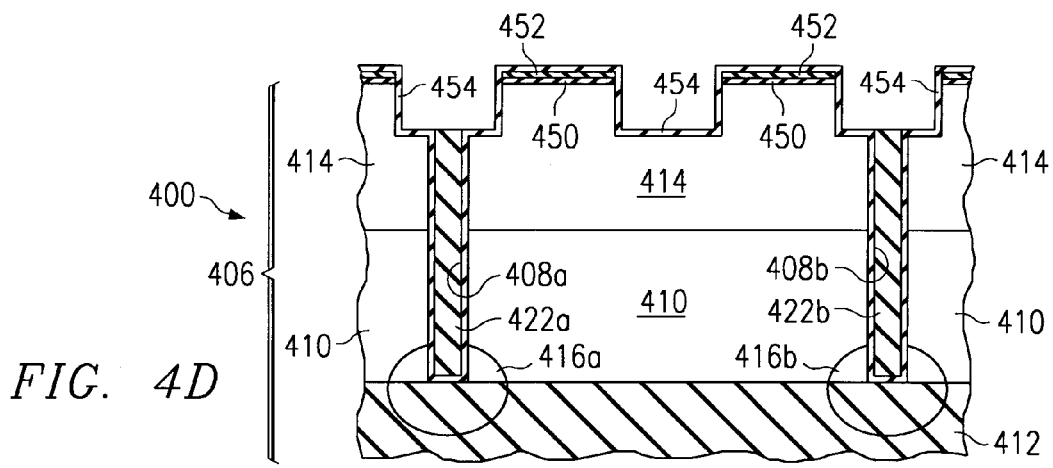

FIG. 4D illustrates deep trench isolation structures 408, deep trench plugs 422, and a liner layer 454. Deep trench isolation structures 408 may be formed by a suitable etching process such as dry etching into second shallow trench liner layer 462, first shallow trench liner layer 460, and substrate 406. A deep trench isolation structure 408 may be formed where a shallow trench isolation structure 430 meets the outer surface of substrate 406. Polymers produced during the formation of deep trench isolation structures 408 may be removed by wet etching.

Channel stop implant regions 416 may be formed from a suitable implantation of ions such as implantation of boron or phosphorus ions at an energy of 10 to 100 KeV at a dose of 1 E 12 to 1 E 14 ions-cm$^{-2}$ through deep trench isolation structures 408. After formation of deep trench isolation structures 408, deep trench mask layer 415, first shallow trench liner layer 460, and second shallow trench liner layer 462 may be removed by a suitable stripping process such as wet-etching. A liner layer 454 may compromise an insulative material such as silicon dioxide or silicon nitrate deposited outwardly from deep trench isolation structures 408 and shallow trench isolation structures 430 to a suitable thickness such as approximately 100 to 200 Å.

Deep trench plugs 422 may comprise a suitable insulative material such as silicon dioxide deposited within deep trench isolation structures 408 using a suitable deposition process such as chemical vapor deposition. Polycrystalline silicon may also be deposited outwardly from deep trench plug 422 followed by a dry-etch process to form deep trench plugs 422.

Figure 4E:
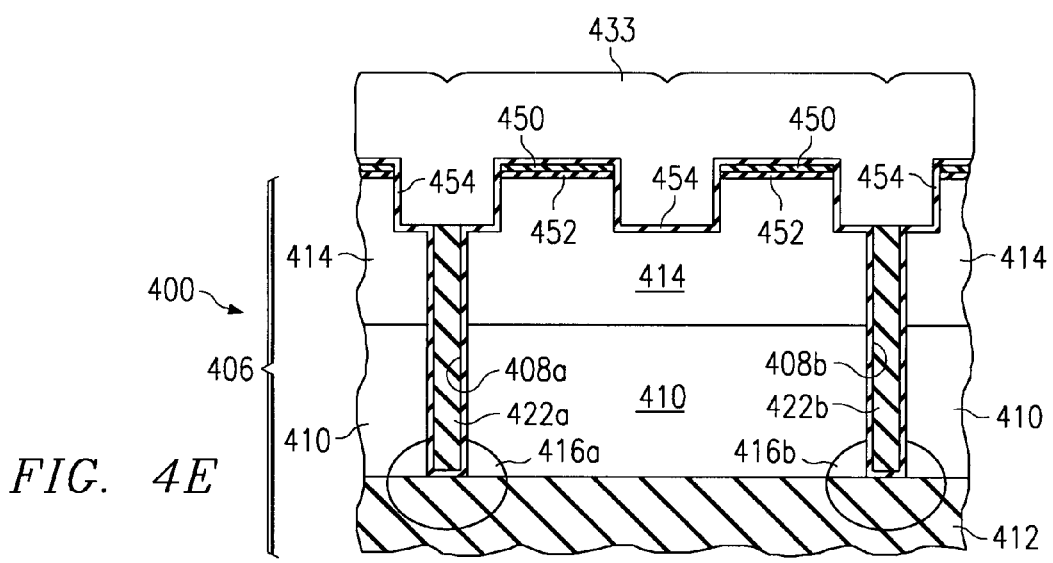

FIG. 4E illustrates a shallow trench plug layer 433. Shallow trench plug layer may be substantially similar to shallow trench plug layer 133 as described in FIG. 1D.

Figure 4F:
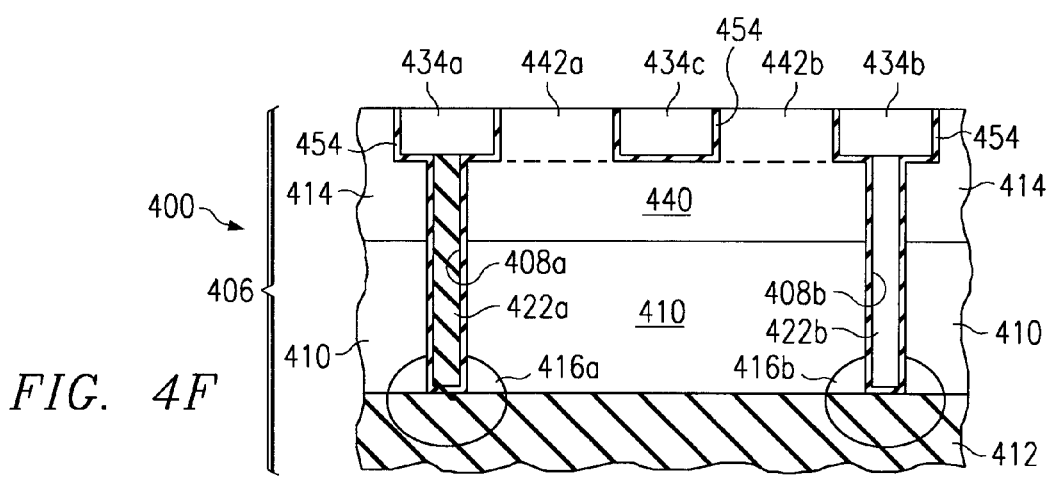

FIG. 4F illustrates active regions 424 and deep trench isolated region 440. Shallow trench plugs 434 may be substantially similar to shallow trench plugs 134 as described in FIG. 1E. Active regions 424 and deep trench isolated region 440 may be substantially similar to active regions 124 and deep trench isolated region 140 as described in connection with FIG. 1E.

Embodiments of the invention may provide numerous technical advantages. A technical advantage of one embodiment is that shallow trench isolation structures are formed outwardly from deep trench isolation structures. This configuration provides sufficient isolation of transistors, bipolar transistors, and other elements of a semiconductor device while using minimal surface area.

A technical advantage of another embodiment is that an over-etching process may be performed during formation of the shallow trench isolation structures in order to reduce formation of oxide or nitride spikes. A technical advantage of another embodiment is that the deep trench isolation structures are faceted. Faceted deep trench isolation structures have smoother sidewalls, which reduces peaks during formation of shallow trench isolation structures. Additionally, the faceting may also allow for easier deposition of material into deep trench isolation structures during formation of deep trench plugs.

Although an embodiment of the invention and its advantages are described in detail, a person skilled in the art could make various alterations, additions, and omissions without departing from the spirit and scope of the present invention as defined by the appended claims.

What is claimed is:

1. A method for constructing a semiconductor device, the method comprising:

providing a semiconductor substrate comprising an inner substrate, a buried insulator layer, and an outer substrate;

forming a deep trench isolation through said buried insulator layer;

depositing a deep trench plug layer within the deep trench isolation structure;

forming a shallow trench isolation structure where the deep trench isolation structure meets the surface of the semiconductor substrate; and depositing a shallow trench plug layer within the shallow trench isolation structure.

2. The method of claim 1, wherein the deep trench plug layer comprises polycrystalline silicon.

3. The method of claim 1, further comprising forming a channel stop region by performing an ion implantation into the semiconductor substrate through the deep trench isolation structure.

4. The method of claim 1, wherein the deep trench isolation structure has a depth of at least approximately two microns.

5. The method of claim 1, wherein the shallow trench isolation structure has a depth of less than approximately two microns.

6. The method of claim 1, further comprising:
growing a first liner layer comprising silicon dioxide on an inner surface of the deep trench isolation structure; and
depositing a second liner layer comprising silicon nitride outwardly from the first liner layer.

7. The method of claim 1, wherein depositing the deep trench plug layer occurs prior to forming the shallow trench isolation structure.

8. The method of claim 1, further comprising:
growing a liner layer on an inner surface of the deep trench isolation structure; and
over-etching the liner layer to form the shallow trench isolation structure.

9. The method of claim 1, wherein forming the shallow trench isolation structure occurs prior to depositing the deep trench plug layer.

10. The method of claim 1, further comprising:
depositing a resist layer within the deep trench isolation structure to form a resist plug; and
forming the shallow trench isolation structure proximate the resist plug.

11. The method of claim 1, wherein the deep trench isolation structure is faceted.

12. A method for constructing a semiconductor device, the method comprising:
providing a semiconductor substrate comprising an inner substrate, a buried insulator, and an outer substrate;
forming a shallow trench isolation structure proximate a surface of a semiconductor substrate;
etching the shallow trench isolation structure to form a deep trench isolation structure where the shallow trench isolation structure meets the surface of the semiconductor substrate and where a bottom surface of the deep trench isolation structure comprises said buried insulator;
depositing a deep trench plug layer within the deep trench isolation structure;
depositing a shallow trench plug layer within the shallow trench isolation structure.

13. The method of claim 12, wherein the deep trench plug layer comprises polycrystalline silicon.

14. The method of claim 13, further comprising forming a channel stop region by performing an ion implantation into the semiconductor substrate through the deep trench isolation structure.

15. The method of claim 12, wherein the deep trench isolation structure has a depth of at least approximately two microns.

16. The method of claim 12, wherein the shallow trench isolation structure has a depth of less than approximately two microns.

17. A semiconductor device, comprising:
a semiconductor substrate comprising an inner substrate, a buried insulator layer, and an outer substrate, a surface of the semiconductor substrate defining a deep trench isolation structure formed through said buried insulator layer and a shallow trench isolation structure, the deep trench isolation structure meeting the surface of the semiconductor substrate where the shallow trench isolation structure meets the surface of the semiconductor substrate;
a deep trench plug deposited within the deep trench isolation structure; and
a shallow trench plug deposited within the shallow trench isolation structure.

18. The semiconductor device of claim 17, wherein the deep trench plug comprises polycrystalline silicon.

19. The semiconductor device of claim 17, further comprising a channel stop region proximate the deep trench isolation structure.

20. The semiconductor device of claim 17, wherein the deep trench isolation structure has a depth of at least approximately two microns.

21. The semiconductor device of claim 17, wherein the shallow trench isolation structure has a depth of less than approximately two microns.

22. The semiconductor device of claim 17, further comprising:
a first liner layer comprising silicon dioxide formed on an inner surface of the deep trench isolation structure; and
a second liner layer comprising silicon nitride deposited outwardly from the first liner layer.

23. The semiconductor device of claim 17, further comprising a liner layer on an inner surface of the deep trench isolation structure, the liner layer over-etched to form the shallow trench isolation structure.

24. The semiconductor device of claim 17, wherein the deep trench isolation structure is faceted.

25. A method for constructing a semiconductor device, the method comprising:
providing a semiconductor substrate comprising an inner substrate, a buried insulator layer, and an outer substrate;
forming a deep trench isolation structure through the buried insulator layer wherein the deep trench structure has a depth of approximately 2 microns;
depositing a deep trench plug layer comprising polycrystalline silicon within the deep trench isolation structure;
forming a channel stop region by performing an ion implantation into the semiconductor substrate through the deep trench isolation structure;
growing a first liner layer comprising silicon dioxide on an inner surface of the deep trench isolation structure;
depositing a second liner layer comprising silicon nitride outwardly from the first liner layer;
over-etching the first liner layer and the second liner layer to form a shallow trench isolation structure where the deep trench isolation structure meets the surface of the semiconductor substrate, the shallow trench isolation structure having a depth of approximately 0.3 to 0.5 microns; and
depositing a shallow trench plug layer within the shallow trench isolation structure.

* * * * *